US009287121B2

(12) United States Patent
Momose et al.

(10) Patent No.: US 9,287,121 B2
(45) Date of Patent: Mar. 15, 2016

(54) SIC EPITAXIAL WAFER AND METHOD FOR MANUFACTURING SAME (75) Inventors: Kenji Momose, Chichibu (JP); Michiya Odawara, Chichibu (JP); Daisuke Muto, Chichibu (JP); Yoshiaki Kageshima, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 14/240,662

(22) PCT Filed: Sep. 4, 2012

(86) PCT No.: PCT/JP2012/072454
§ 371 (c)(1),
(2), (4) Date: Feb. 24, 2014

(87) PCT Pub. No.: WO2013/035691
PCT Pub. Date: Mar. 14, 2013

(65) Prior Publication Data
US 2014/0175461 A1 Jun. 26, 2014

(30) Foreign Application Priority Data
Sep. 9, 2011 (JP) ................. 2011-197626

(51) Int. Cl.
*H01L 21/02* (2006.01)
*C30B 25/20* (2006.01)
(Continued)

(52) U.S. Cl.
CPC ........ *H01L 21/02617* (2013.01); *C30B 25/186* (2013.01); *C30B 25/20* (2013.01); *C30B 29/36* (2013.01); *H01L 21/02024* (2013.01);
(Continued)

(58) Field of Classification Search
None
See application file for complete search history.

(56) References Cited

U.S. PATENT DOCUMENTS 6,596,080 B2 * 7/2003 Kawahara et al. ............ 117/106
8,716,718 B2 * 5/2014 Momose ............... C23C 16/325
257/77
(Continued)

FOREIGN PATENT DOCUMENTS

CN  1877877 A  12/2006
EP  2 514 857 A1  10/2012
(Continued)

OTHER PUBLICATIONS

Skowronski M et al: "Degradation of hexagonal silicon-carbide-based bipolar devices", Journal of Applied Physics, American Institute of Physics, US, vol. 99, No. 1, Jan. 13, 2006, pp. 011101-1-011101-24, XP012083153, ISSN: 0021-8979, DOI: 10.1063/1.2159578.
(Continued)

*Primary Examiner* — Benjamin Sandvik
(74) *Attorney, Agent, or Firm* — Sughrue Mion, PLLC (57) ABSTRACT A method of manufacturing a SiC epitaxial wafer wherein a SiC epitaxial layer is provided on a SiC single crystal substrate having an off angle. The method includes determining a ratio of basal plane dislocations (BPD) which cause stacking faults in a SiC epitaxial film of a prescribed thickness, to basal plane dislocations which are present on a growth surface of the SiC single crystal substrate, determining an upper limit of surface density of basal plane dislocations, preparing a SiC single crystal substrate which has surface density equal to or less than the above upper limit, and forming a SiC epitaxial film on the SiC single crystal substrate under the same conditions as the growth conditions of the epitaxial film used in the step of determining the ratio.

6 Claims, 6 Drawing Sheets (51) Int. Cl.
  *C30B 29/36* (2006.01)
  *C30B 25/18* (2006.01)
  *H01L 29/32* (2006.01)
  *H01L 29/16* (2006.01)
  *H01L 29/04* (2006.01)

(52) U.S. Cl.
  CPC ...... *H01L21/02046* (2013.01); *H01L 21/0262* (2013.01); *H01L 21/02378* (2013.01); *H01L 21/02433* (2013.01); *H01L 21/02529* (2013.01); *H01L 21/02634* (2013.01); *H01L 21/02658* (2013.01); *H01L 29/32* (2013.01); *H01L 29/045* (2013.01); *H01L 29/1608* (2013.01)

(56) References Cited

U.S. PATENT DOCUMENTS

| | | | | |
|---|---|---|---|---|
| 8,900,979 | B2* | 12/2014 | Sudarshan | H01L 21/02658 438/503 |
| 2005/0064723 | A1 | 3/2005 | Sumakeris | |
| 2006/0011128 | A1 | 1/2006 | Ellison et al. | |
| 2007/0290211 | A1 | 12/2007 | Nakayama et al. | |
| 2008/0318359 | A1 | 12/2008 | Yonezawa et al. | |
| 2010/0031877 | A1* | 2/2010 | Gupta et al. | 117/105 |
| 2010/0133550 | A1* | 6/2010 | Zhang | C30B 23/02 257/77 |
| 2011/0045281 | A1* | 2/2011 | Myers-Ward | C30B 25/20 428/332 |

FOREIGN PATENT DOCUMENTS

| | | |
|---|---|---|
| JP | 2004-289023 A | 10/2004 |
| JP | 2005-311348 A | 11/2005 |
| JP | 2006-028016 A | 2/2006 |
| JP | 2006-237125 A | 9/2006 |
| JP | 2008-311541 A | 12/2008 |
| JP | 2011-049496 A | 3/2011 |
| WO | 2005/093137 A1 | 10/2005 |
| WO | 2011/074453 A1 | 6/2011 |

OTHER PUBLICATIONS

Hassan J et al: "Characterization of the carrot defect in 4H-SiC epitaxial layers", Journal of Crystal Growth, Elsevier, Amsterdam, NL, vol. 312, No. 11, May 15, 2010, pp. 1828-1837, XP027030740, ISSN: 0022-0248 [retrieved on Jun. 3, 2010].

Extended European Search Report dated Mar. 17, 2015, issued by the European Patent Office in counterpart European application No. 12829619.1.

T. Ohno et al., "Influence of growth conditions on basal plane dislocation in 4H-SiC epitaxial layer", Journal of Crystal Growth, 2004, pp. 1-7, vol. 271.

H. Tsuchida et al., "Comparison of Propagation and Nucleation of Basal Plane Dislocations in 4H-SiC(000-1) and (0001) Epitaxy", Materials Science Forum, 2006, pp. 231-234, vols. 527-529.

H. Jacobson et al., "Properties and origins of different stacking faults that cause degradation in SiC PiN diodes", Journal of Applied Physics, 2004, pp. 1485-1488, vol. 95.

International Search Report of PCT/JP2012/072454 dated Dec. 11, 2012.

Communication dated Oct. 16, 2015, issued by the State Intellectual Property Office of the P.R.C. in corresponding Chinese Application No. 201280042735.X.

Communication dated Sep. 15, 2015, issued by the Japan Patent Office in corresponding Japanese Application No. 2011-197626.

* cited by examiner

SIC EPITAXIAL WAFER AND METHOD FOR MANUFACTURING SAME

CROSS REFERENCE TO RELATED APPLICATIONS

This is a National Stage of International Application No. PCT/JP2012/072454 filed Sep. 4, 2012, claiming priority based on Japanese Patent Application No. 2011-197626 filed Sep. 9, 2011, the contents of all of which are incorporated herein by reference in their entirety.

TECHNICAL FIELD

The present invention relates to a SiC epitaxial wafer and a manufacturing method thereof.

BACKGROUND ART

Silicon carbide (SiC) has the superior properties of having insulation breakdown voltage roughly ten times stronger and bandgap roughly three times larger than silicon (Si), and is expected to be used in applications such as power devices, high-temperature operation devices.

These SiC devices are normally fabricated using SiC epitaxial wafers obtained by growing a SiC epitaxial film serving as the active region of the device by a method such as chemical vapor deposition (CVD) on a SiC single crystal substrate obtained by processing SiC bulk single crystals grown by a method such as sublimation recrystallization.

SiC single crystal substrates contain numerous crystal defects, and these crystal defects are known to propagate to the epitaxial film. Consequently, technologies have been developed for improving the quality of epitaxial films in consideration of this propagation.

Known examples of methods used to non-destructively detect crystal defects such as dislocations or stacking faults contained in SiC single crystal substrates and SiC epitaxial wafers, where an epitaxial film is formed on the substrate, include X-ray topography (Non-Patent Documents 1 and 2) and photoluminescence (Patent Document 1).

Three types of dislocations (consisting of threading screw dislocations (TSD), threading edge dislocations (TED) and basal plane dislocations (BPD)) are known to be present as linear crystal defects in SiC single crystals. TSD are dislocations in which the Burgers vector that propagates in the direction of the c-axis is <0001> or double thereof. TED are dislocations in which the Burgers vector that propagates in the direction of the c-axis is ⅓<11-20>. BPD are Dislocations in which the Burgers vector present on the c-plane is ⅓<11-20>.

SiC epitaxial films are typically formed by using a surface in which step density has been intentionally increased by inclining a SiC single crystal substrate from the (0001) plane (c-plane) in the direction of <11-20> at an off angle of within 10° as a growth surface, and growing crystals in the horizontal direction of the step (step flow growth).

Since a surface having an off angle with respect to the c-plane is used for the growth surface in this manner, basal plane dislocations (BPD) present on the c-plane are exposed on the growth surface. In addition, threading screw dislocations (TSD) and threading edge dislocations (TED) extending in the direction of the c-axis are also exposed on the growth surface.

Basal plane dislocations (BPD) that have propagated to an epitaxial film are not stable in the epitaxial film and easily degrade to two energetically advantageous Shockley partial dislocations, resulting in the formation of stacking faults between these two Shockley partial dislocations. Since stacking faults act as carrier lifetime killers, current ends up concentrating in those regions where stacking faults are not present, and as a result of a decrease in the surface area where current flows, on-resistance ends up increasing. Moreover, in bipolar devices such as pn diodes, one of the aforementioned two partial dislocations has Si as the core thereof while the other has C as the core thereof. Therefore, only the partial dislocation having a Si core migrates due to recombination energy of electrons and holes, and the area of the stacking fault ends up increasing (Non-Patent Document 3).

In addition, carrot defects present in epitaxial films are known to be formed by interaction between basal plane dislocations (BPD) and threading screw dislocations (TSD) of SiC single crystal substrates.

BACKGROUND ART DOCUMENTS

Patent Documents

Patent Document 1: Japanese Unexamined Patent Application, First Publication No. 2004-289023

Non-Patent Documents

Non-Patent Document 1: J. Crystal Growth, 271 (2004) 1
Non-Patent Document 2: Mat. Sci. Forum, 527-529 (2006) 231
Non-Patent Document 3: H. Jacobson, et al., J. Appl. Phys. 95 (2004) 1485

DISCLOSURE OF THE INVENTION

Problems to be Solved by the Invention

As has been previously described, a portion of the basal plane dislocation (BPD) present on the growth surface of SiC single crystal substrates are known to become stacking faults in SiC epitaxial films. In addition, carrot defects are known to be formed by interaction between basal plane dislocations (BPD) and threading screw dislocations (TSD) of SiC single crystal substrates.

A persons with ordinary skill in the art recognized that the ratio of basal plane dislocations present on the growth surface of SiC single crystal substrates that become stacking faults in a SiC epitaxial film formed on SiC single crystal substrates is dependent on various factors, the identity of those factors as well as which of those factors. However, functions as the primary factor are not fully understood even by such a person. Consequently, a person with ordinary skill in the art would not be able to predict to what degree a given amount of the surface density of basal plane dislocation (BPD) of a SiC single crystal substrate would effect a given amount of surface density of stacking faults of a SiC epitaxial film, where the stacking faults originate from the basal plane dislocations (BPD). This applies similarly to carrot defects as well.

The inventors of the present invention found that, in the case of forming a SiC epitaxial film of a prescribed thickness on the surface of a SiC single crystal substrate having a prescribed off angle under prescribed epitaxial film growth conditions, the surface density of stacking faults, which are caused by basal plane dislocations (BPD) of a substrate and are formed in the SiC epitaxial film, has regularity in that the surface density is nearly proportional to the surface density of the basal plane dislocations (BPD) in the SiC single crystal substrate. As a result, in the case of forming a SiC epitaxial film of a prescribed thickness using a SiC single crystal substrate having a prescribed off angle under prescribed epitaxial film growth conditions, the surface density of stacking faults which are caused by basal plane dislocations (BPD) and formed in the SiC epitaxial film formed can be predicted if the surface density of basal plane dislocations (BPD) on the growth surface of the SiC single crystal substrate is known, thereby leading to completion of the present invention.

In addition, with respect to carrot defects, it was found that, in the case densities of basal plane dislocations (BPD) and threading screw dislocations (TSD) are high, the surface density of carrot defects in a SiC epitaxial film correlates with the surface density of basal plane dislocations (BPD) in a SiC single crystal substrate. As a result, in the case of forming a SiC epitaxial film of a prescribed thickness using a SiC single crystal substrate having a prescribed off angle under prescribed epitaxial film growth conditions, the surface density of carrot defects in the SiC epitaxial film formed can be predicted if the surface densities of basal plane dislocations (BPD) and threading screw dislocations (TSD) on the growth surface of the SiC single crystal substrate are known, thereby also leading to completion of the present invention.

An object of the present invention is to provide a SiC epitaxial wafer, in which the surface density of stacking faults present in a SiC epitaxial film attributable to basal plane dislocations on the growth surface of a SiC single crystal substrate is reduced, and a manufacturing method thereof.

In addition, an object of the present invention is to provide a SiC epitaxial wafer, in which the surface density of carrot defects present in a SiC epitaxial film are reduced, and a manufacturing method thereof.

Means for Solving the Problems

The present invention employs the following configurations to achieve the aforementioned objectives.

(1) A method of manufacturing a SiC epitaxial wafer in which a SiC epitaxial layer is provided on a SiC single crystal substrate having an off angle, comprising:
a step of determining a ratio of basal plane dislocations (BPD), which causes stacking faults in a SiC epitaxial film of a prescribed thickness which is formed on a SiC single crystal substrate having an off angle, to basal plane dislocations which are present on a growth surface of the SiC single crystal substrate,
a step of determining an upper limit of surface density of basal plane dislocations on the growth surface of a SiC single crystal substrate used based on the above ratio, and
a step of preparing a SiC single crystal substrate which has surface density equal to or less than the above upper limit, and forming a SiC epitaxial film on the SiC single crystal substrate under the same conditions as the growth conditions of the epitaxial film used in the step of determining the ratio.

(2) The method of manufacturing a SiC epitaxial wafer according to claim 1, in which, when determining the ratio, the surface density of BPD on the growth surface and a surface density of stacking faults in the SiC epitaxial film caused by the BPD on the growth surface are measured by X-ray topography or photoluminescence.

(3) The method of manufacturing a SiC epitaxial wafer according to claim 1 or claim 2, in which the upper limit is $1.0 \times 10^3$ BPD/cm$^2$ or less.

(4) A method of manufacturing a SiC epitaxial wafer provided with a SiC epitaxial layer on a SiC single crystal substrate having an off angle, comprising:
a step of determining a ratio of basal plane dislocations (BPD) and threading screw dislocations (TSD), which cause carrot defects in a SiC epitaxial film of a prescribed thickness which is formed on a SiC single crystal substrate having an off angle, to all basal plane dislocations and threading screw dislocations which are present on a growth surface of the SiC single crystal substrate,
a step of determining an upper limit of surface density of BPD and TSD on the growth surface of a SiC single crystal substrate used based on the above ratio, and
a step of preparing a SiC single crystal substrate which has surface density equal to or less than the above upper limit, and forming a SiC epitaxial film on the SiC single crystal substrate under the same conditions as the growth conditions of the epitaxial film used in the step of determining the ratio.

(5) A SiC epitaxial wafer provided with a SiC epitaxial layer on a SiC single crystal substrate having an off angle, in which the surface density of stacking faults caused by BPD of the SiC single crystal substrate is 0.1 stacking faults/cm$^2$ or less in the SiC epitaxial film.

Effects of the Invention

According to the aforementioned configurations, a SiC epitaxial wafer can be provided in which the surface density of stacking faults is reduced. In addition, a SiC epitaxial wafer can be provided in which the surface density of carrot defects is reduced.

BEST MODE FOR CARRYING OUT THE INVENTION

The following provides a detailed explanation of a SiC epitaxial wafer and manufacturing method thereof to which the present invention is applied with reference to the drawings.

[SiC Epitaxial Wafer]

Figure 1:
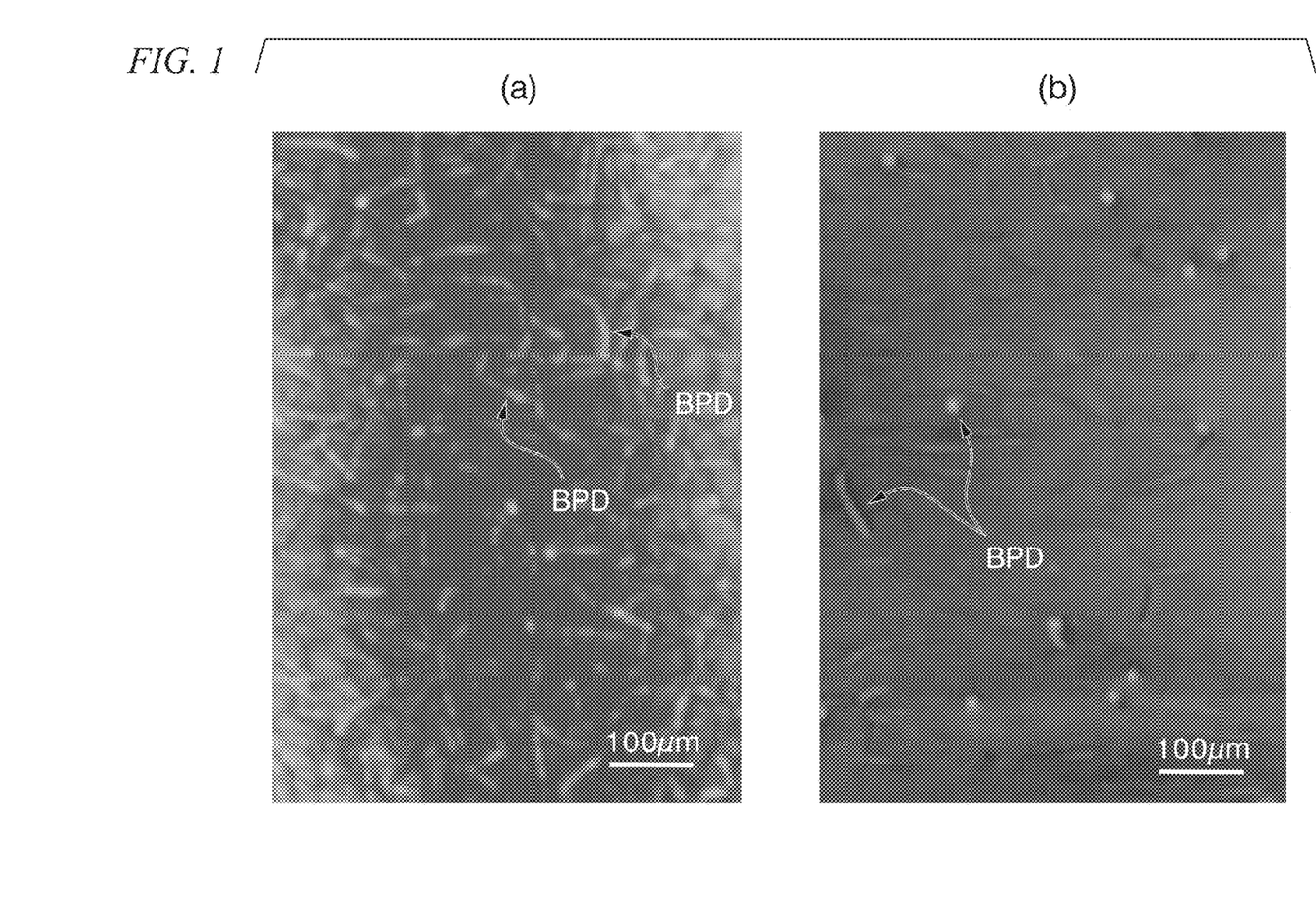
FIG. 1 are topographs of SiC single crystal substrates, with (a) indicating that having a basal plane dislocation (BPD) density of $6.5 \times 10^4$ BPD/cm$^2$, and (b) indicating that having a basal plane dislocation (BPD) density of $5.5 \times 10^3$ BPD/cm$^2$.

FIGS. 1(a) and 1(b) depict topographs of SiC single crystal substrates obtained by X-ray topography. FIGS. 1(a) and 1(b) indicate that having a basal plane dislocation (BPD) density of $6.5 \times 10^4$ BPD/cm$^2$ and $5.5 \times 10^3$ BPD/cm$^2$, respectively.

The arrows in the topographs indicate a portion of the basal plane dislocations (BPD).

<X-Ray Topography Measurement>

In the present invention, crystal defects in the wafer surface can be detected by measuring diffracted X-rays from single crystal wafers of silicon carbide using reflection X-ray topography. The use of reflection X-ray topography offers the advantage of being able to detect the locations of crystal defects non-destructively without using etching or other destructive techniques.

Synchrotron radiation was used for the X-ray source used in the present invention, and it enables independent detection of basal plane dislocations, threading edge dislocations and threading screw dislocations present in crystals. The data indicated in the present description was obtained at the Spring-8 synchrotron radiation.

Reflection X-ray topography measurements were carried out using X-rays having a wavelength of 1.54 Å as determined using a monochromator for the incident light. Although there are no particular limitations on the diffraction vector (g-vector) used during X-ray diffraction provided it allows the object of the present invention to be achieved, a g-vector of 11-28 or 1-108 is ordinarily used for 4H—SiC crystals. Topography images indicated in the present description were obtained using a g-vector of 11-28.

Topographic images can be obtained by irradiating a sample with X-rays and detecting the diffracted light reflected from the sample. A recording medium such as a high-resolution X-ray film or nuclear plate is used to acquire these topographic images in order to obtain adequate resolution for determining the type of defect. A nuclear plate was used in the case described below. The numbers of basal plane dislocations, threading edge dislocations and threading screw dislocations are then counted from these images.

Figure 2:
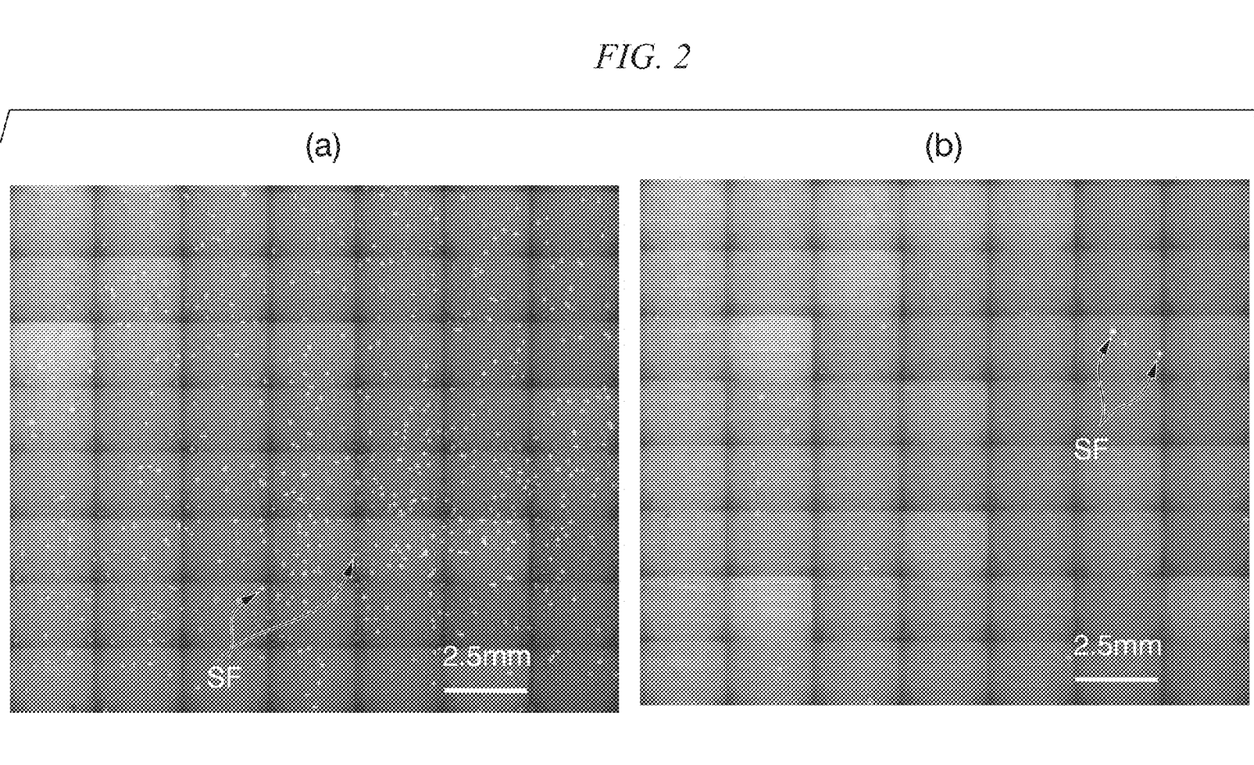
FIG. 2 are PL images of SiC epitaxial wafers using the SiC single crystal substrates shown in FIG. 1, with (a) indicating that having a stacking fault (SF) density of $2.5 \times 10^2$ SF/cm$^2$, and (b) indicating that having a stacking fault (SF) density of 9.2 SF/cm$^2$.

FIGS. 2(a) and 2(b) are PL images obtained by photoluminescence (PL) imaging of SiC epitaxial wafers provided with a SiC epitaxial film having a thickness of 10 μm formed on the SiC single crystal substrates shown in FIGS. 1(a) and 1(b). Furthermore, the SiC epitaxial wafers shown in FIGS. 2(a) and 2(b) were simultaneously formed using the same production lot.

In FIGS. 2(a) and 2(b), a stacking fault (SF) surface density in an epitaxial film thereof is $2.5 \times 10^2$ SF/cm$^2$ and 9.2 SF/cm$^2$, respectively.

The arrows in the images indicate a portion of the basal plane dislocations (BPD) or stacking faults (SF).

Table 1 indicates the four surface densities of basal plane dislocations (BPD) of SiC single crystal substrates, and surface densities of stacking faults in epitaxial films of SiC epitaxial wafers provided with SiC epitaxial films having a thickness of 10 μm formed on the SiC single crystal substrates having those BPD surface densities. The four surface densities of the basal plane dislocations (BPD) consist of the surface densities of the samples of SiC single crystal substrates shown in FIG. 1 as well as the surface densities of BPD densities of $3.2 \times 10^4$ BPD/cm$^2$ and $3.0 \times 10^2$ BPD/cm$^2$.

TABLE 1

| Basal plane dislocation density (BPD/cm$^2$) | Stacking fault density (SF/cm$^2$) |
|---|---|
| $6.5 \times 10^4$ | $2.5 \times 10^2$ |
| $3.2 \times 10^4$ | $8.0 \times 10$ |
| $5.5 \times 10^3$ | 9.2 |
| $6.5 \times 10^2$ | 0.13 |

Figure 3:
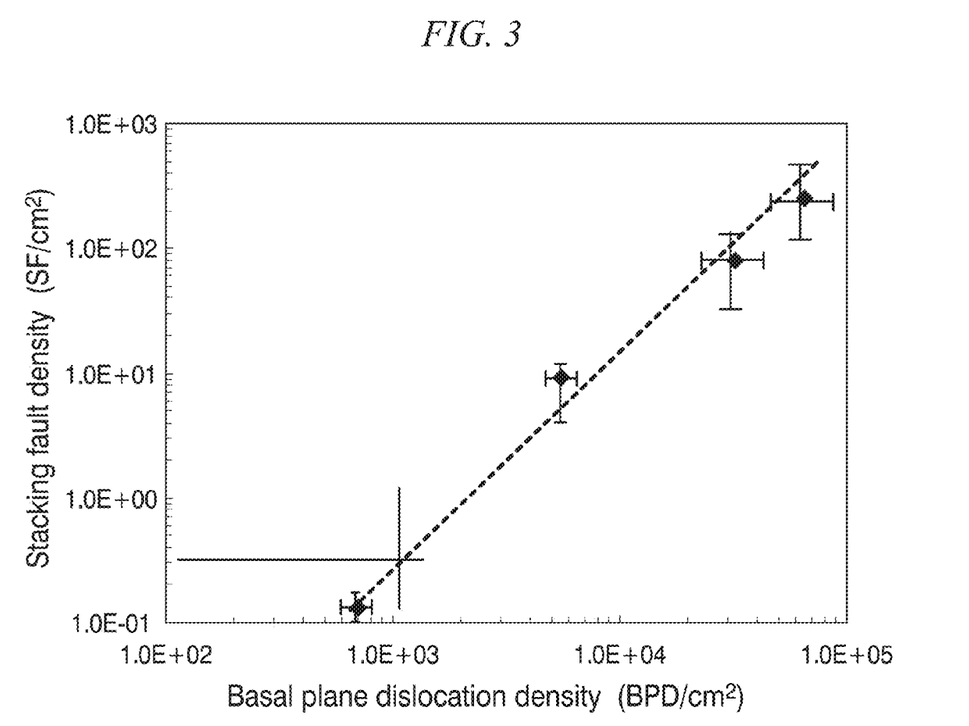
FIG. 3 is a graph indicating the correlation between basal plane dislocation (BPD) density of a SiC single crystal substrate and stacking fault (SF) density in an epitaxial film based on the data shown in Table 1.

FIG. 3 depicts a graph in which the surface densities of basal plane dislocations (BPD) of SiC single crystal substrates are plotted on the horizontal axis and the surface densities of stacking faults (SF) in an epitaxial film are plotted on the vertical axis based on the data shown in Table 1.

BPD surface density and SF surface density can be understood to have a nearly proportional relationship. As a result of having this relationship, it is possible to determine the upper limit of BPD surface density of a SiC single crystal substrate required to fabricate a SiC epitaxial wafer having a desired SF surface density.

Figure 4:
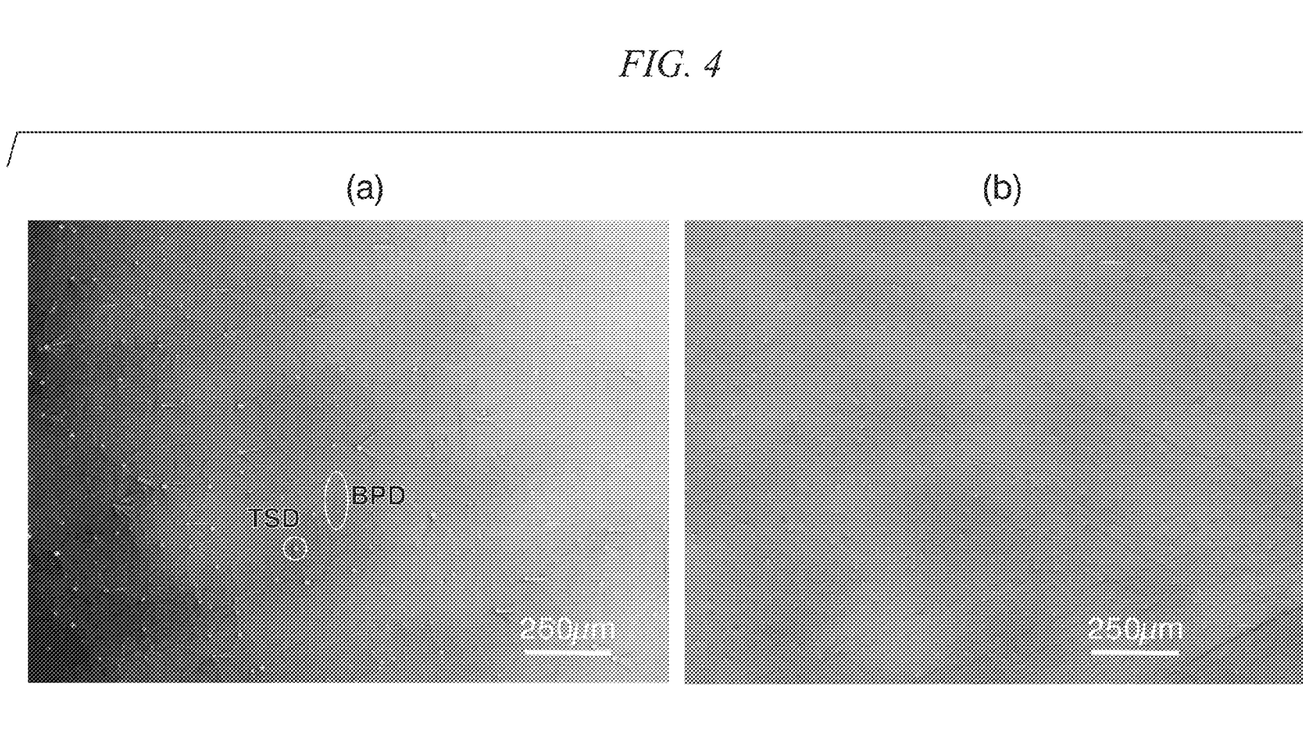
FIG. 4 are topographs of SiC single crystal substrates, with (a) indicating that having a basal plane dislocation (BPD) density of $5.0 \times 10^4$ BPD/cm$^2$ and a threading screw dislocation (TSD) density of $2.8 \times 10^4$ TSD/cm$^2$, and (b) indicating that having a basal plane dislocation (BPD) density of $2.0 \times 10^4$ BPD/cm$^2$ and a threading screw dislocation (TSD) density of $5.4 \times 10^3$ TDS/cm$^2$.

FIGS. 4 (a) and 4(b) depict topographic images of SiC single crystal substrates obtained by radiation topography.

FIGS. 4(a) and 4(b) respectively indicate SiC single crystal substrates having a basal plane dislocation (BPD) surface density of $5.0 \times 10^4$ BPD/cm$^2$ and threading screw dislocation (TSD) surface density of $2.8 \times 10^4$ TSD/cm$^2$, and a basal plane dislocation (BPD) surface density of $2.0 \times 10^4$ BPD/cm$^2$ and threading screw dislocation (TSD) surface density of $5.4 \times 10^3$ TDS/cm$^2$, respectively.

A typical basal plane dislocation (BPD) and threading screw dislocation (TSD) are shown in the image depicted in FIG. 4(a).

Figure 5:
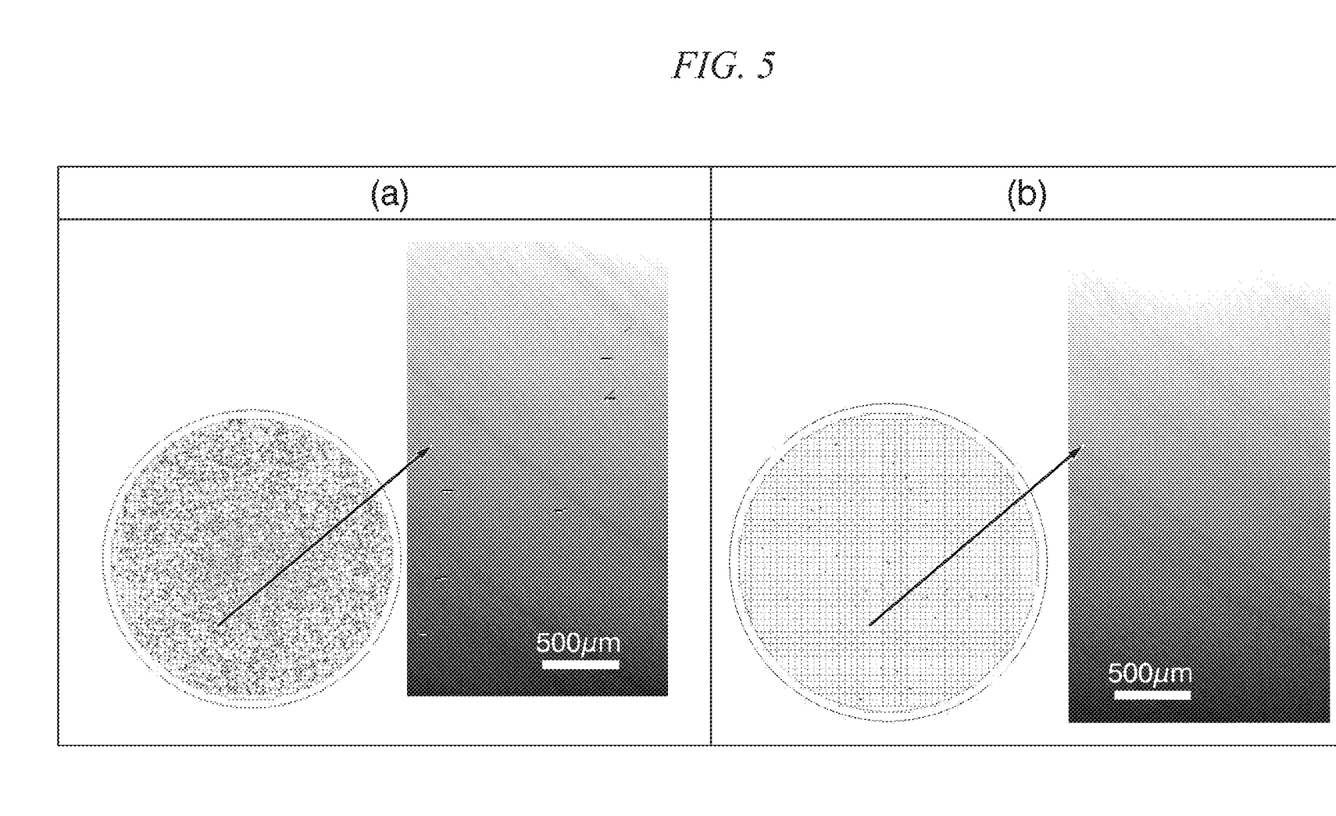
FIG. 5 are Candela images of SiC epitaxial wafers using the SiC single crystal substrates shown in FIG. 4, with (a) indicating that using the SiC single crystal substrate shown in FIGS. 4(a), and (b) indicating that using the SiC single crystal substrate used in FIG. 4(b).

FIGS. 5(a) and 5(b) depict Candela images of SiC epitaxial wafers provided with a SiC epitaxial film having a thickness of 10 μm formed on the SiC single crystal substrates shown in FIGS. 4(a) and 4(b), and the images are obtained with an optical surface inspection apparatus (Candela). Furthermore, the SiC epitaxial wafers shown in FIGS. 5(a) and 5(b) were simultaneously formed using the same production lot.

In each of FIGS. 5(a) and 5(b), the image on the left indicates a defect map, while the image on the right is a Candela image indicated with the arrow of the defect map on the left.

In FIGS. 5(a) and 5(b), carrot defect densities in an epitaxial film are 20.2 defects/cm$^2$ and 0.2 defects/cm$^2$, respectively.

[Method for Manufacturing SiC Epitaxial Wafer]

The following provides a detailed explanation of embodiments of the present invention in the form of methods for manufacturing a SiC epitaxial wafer.

First Embodiment

A first embodiment of the present invention is a method of manufacturing a SiC epitaxial wafer, and is characterized as a method of manufacturing a SiC epitaxial wafer in which a SiC epitaxial layer is provided on a SiC single crystal substrate having an off angle. The method comprises: a step of determining a ratio of basal plane dislocations (BPD), which causes stacking faults in a SiC epitaxial film of a prescribed thickness which is formed on a SiC single crystal substrate having an off angle, to all basal plane dislocations which are present on a growth surface of the SiC single crystal substrate, a step of determining an upper limit of surface density of basal plane dislocations on the growth surface of a SiC single crystal substrate used based on the above ratio, and a step of preparing a SiC single crystal substrate which has surface density equal to or less than the above upper limit, and forming a SiC epitaxial film on the SiC single crystal substrate under the same conditions as the growth conditions of the epitaxial film used in the step for determining the ratio.

<SiC Single Crystal Substrate>

Any type of polytype SiC single crystal substrate can be used for the SiC single crystal substrate, and a 4H—SiC single crystal substrate, which is mainly used to fabricate practical SiC devices, can be used. A SiC single crystal substrate processed from a bulk crystal fabricated by a method such as sublimation can be used for the substrate of the SiC device, and a SiC epitaxial film serving as the active region of the SiC device is normally formed thereon by chemical vapor deposition (CVD).

In addition, the off angle of the SiC single crystal substrate may be any arbitrary off angle, and although there are no limitations thereon, a SiC single crystal substrate having a small off angle of, for example, 0.4° to 5° is preferable from the viewpoint of reducing costs. An off angle of 0.4° C. can be said to be the lower limit for use as an off angle enabling step-flow growth.

In the case of a SiC single crystal substrate having a size up to about 2 inches, an off angle of 8° is mainly used for the off angle of the SiC single crystal substrate. This off angle results in a small terrace width of the wafer surface and allows step-flow growth to be easily obtained. However, since the number of wafers able to be obtained from a SiC ingot decreases as the off angle becomes larger, an off angle of about 4° is mainly used in the case of SiC substrates having a size of 3 inches or larger.

The terrace width of the surface of the SiC single crystal substrate increases as the off angle becomes smaller. Accordingly, in such a case, there is increased susceptibility to variation in the rate at which migrating atoms are incorporated into the step edges, or in other words, the growth rate of the step edges. As a result, steps having a faster growth rate end up catching up to steps having a slower growth rate, causing them to bunch together and resulting in increased susceptibility to the occurrence of step bunching. In the case of a substrate having an off angle of 0.4°, for example, terrace width is 10 times greater than a substrate having an off angle of 4°, and since the length over which step-flow growth occurs becomes longer by a factor of 10, it is necessary to note that the conditions for step-flow growth that have been used for a substrate having an off angle of 4° must be adjusted when using for a substrate having an off angle of 0.4°.

As a SiC single crystal substrate, a SiC single crystal substrate in which the growth surface of the SiC epitaxial layer convexly formed can be used.

When manufacturing a SiC epitaxial wafer (that is, when forming (growing) a SiC epitaxial layer), although the back surface of the SiC single crystal substrate is heated directly by a heated susceptor, the top surface (surface on which the SiC epitaxial layer is formed) is exposed to a vacuum space and is not heated directly. Moreover, since a carrier gas in the form of hydrogen flows over the top surface, heat ends up being carried away. On the basis of these circumstances, the top surface is at a lower temperature than the back surface during epitaxial growth. Due to this temperature difference, the magnitude of thermal expansion is smaller on the top surface than on the back surface, and the top surface of the SiC single crystal substrate ends up being deformed into a concave shape during epitaxial growth. Therefore, by using a SiC single crystal substrate in which the growth surface of the SiC epitaxial layer is convexly formed, epitaxial growth can be carried out while canceling out concave deformation (warping) of the SiC single crystal substrate during epitaxial growth.

Although there are no particular limitations on the thickness of the SiC epitaxial layer, it is, for example, 10 μm when carrying out deposition for 2.5 hours at a typical growth rate of 4 μm/h.

<Polishing Step>

Polishing is first carried out on the SiC single crystal substrate prior to forming a SiC epitaxial layer on the SiC single crystal substrate.

In this polishing step, polishing is carried out to a degree such that a lattice disorder layer of the surface thereof as described in Japanese Unexamined Patent Application, First Publication No. 2011-49496 is about 3 nm or less.

The "lattice disorder layer" refers to a layer in which a banded structure or a portion of the bands thereof corresponding to an atomic layer (lattice) of Si single crystal is not well-defined in a TEM lattice image (image enabling confirmation of the lattice) as shown in FIGS. 7 and 8 of Japanese Unexamined Patent Application, First Publication No. 2011-49496.

Here, the surface density of basal plane dislocations (BPD) present on the growth surface of a SiC single crystal substrate is primarily determined by the degree of finish of this polishing step.

In order to obtain a SiC epitaxial wafer having a desired stacking fault (SF) surface density, polishing is carried out using the polishing method described below until the surface density of basal plane dislocations (BPD) present on the growth surface of the SiC single crystal substrate becomes equal to or less than an upper limit of surface density as determined in the aforementioned upper limit determination step.

For example, the degree of finish of the polishing step required to manufacture a SiC epitaxial wafer having a stacking fault surface density of 0.1 stacking faults/cm$^2$ or less is equivalent to the degree at which the aforementioned lattice disorder layer is 3 nm or less.

The following provides an explanation of an embodiment of this step.

The polishing step includes a plurality of polishing steps such as a rough polishing step normally referred to as wrapping, precision polishing step referred to as polishing, and ultra-precision polishing step in the form of chemical mechanical polishing (CMP). The polishing steps are frequently carried out using a wet method, and a common element to these polishing steps is that a polishing head having a silicon carbide substrate adhered thereto is pressed against a rotating surface plate affixed with an abrasive cloth while supplying polishing slurry. Although the polishing slurry used in the present invention is basically used in these forms, there are no particular limitations on the form used in so far as wet polishing using polishing slurry is used.

The particles used as abrasive grains are particles that disperse without dissolving in this pH range. In the present invention, the pH of the polishing liquid is preferably lower than 2, and in this case, examples of abrasive grains that can be used include diamond, silicon carbide, aluminum oxide, titanium oxide and silicon oxide. In the present invention, the abrasive grains used have a mean diameter of 1 nm to 400 nm, preferably 10 nm to 200 nm and even more preferably 10 nm to 150 nm. In order to obtain a favorable final finish surface, silica is preferable from the viewpoint of silica having a small particle diameter being available commercially and inexpensive. Colloidal silica is more preferable. The particle diameter of the colloidal silica or other abrasive can be suitably selected according to processing characteristics such as processing speed or surface roughness. In the case of requiring a higher polishing speed, an abrasive having a larger particle diameter can be used. When requiring low surface roughness, or in other words, when requiring a highly smooth surface, an abrasive having a small particle diameter can be used. Abrasives having a mean particle diameter in excess of 400 nm do not yield high polishing speed relative to their high cost, thereby making them uneconomical. The use of an abrasive having an extremely small particle diameter of less than 1 nm results in a considerable decrease in polishing speed.

The amount of abrasive grains added is 1% by mass to 30% by mass and preferably 1.5% by mass to 15% by mass. If the amount added exceeds 30% by mass, the drying speed of the abrasive grains becomes excessively fast, resulting in increasing risk of causing scratches as well as being uneconomical. In addition, if the amount of abrasive grains added is less than 1% by mass, processing speed becomes excessively slow, thereby making this undesirable.

The polishing slurry used in the present invention is aqueous polishing slurry that has a pH at 20° C. of lower than 2.0, preferably lower than 1.5 and more preferably lower than 1.2. Adequate polishing speed cannot be obtained at a pH of 2.0 or higher. On the other hand, lowering the pH of the slurry to lower than 2 remarkably increases the chemical reactivity to silicon carbide even in ordinary room environments, resulting in the potential for ultra-precision polishing. Rather than silicon carbide being removed directly by the mechanical action of oxide particles present in the polishing slurry, the mechanism is thought to involve the polishing liquid chemically altering the surface of the silicon carbide single crystal to silicon oxide, and that silicon oxide is then removed by the mechanical action of the abrasive grains. Thus, employing the polishing liquid composition in the form of a liquid that facilitates reaction of silicon carbide, namely lowering the pH to less than 2, and selecting oxide particles having a suitable hardness for use as abrasive grains are extremely important for obtaining a smooth surface that is free of scratches and processing-damaged layers.

The polishing slurry is prepared so that the pH is lower than 2 by using at least one type, and preferably two or more types, of acids such as hydrochloric acid, nitric acid, phosphoric acid or sulfuric acid. Although the reason why the use of a plurality of acids is effective is unknown, it has been confirmed experimentally, and there is the possibility that multiple acids ends up interacting thereby enhancing effectiveness. The amount of acid added is within the range of, for example, 0.5% by mass to 5% by mass in the case of sulfuric acid, 0.5% by mass to 5% by mass in the case of phosphoric acid, 0.5% by mass to 5% by mass in the case of nitric acid or 0.5% by mass to 5% by mass in the case of hydrochloric acid, and the type and amount thereof are suitably selected so that the pH is lower than 2.

The reason why inorganic acids are effective is that they are stronger acids than organic acids and are extremely favorable for preparing a prescribed strongly acidic polishing liquid. The use of organic acid makes it difficult to prepare a strongly acidic polishing liquid.

Polishing of silicon carbide is carried out by removing an oxide layer with oxide particles due to the reactivity of the strongly acidic polishing liquid to the oxide film formed on the surface of silicon carbide, and the addition of an oxidizing agent to the polishing slurry has been recognized to be even more effective for accelerating surface oxidation. Examples of oxidizing agents include hydrogen peroxide, perchloric acid, potassium dichromate and ammonium persulfate. Although the polishing speed is improved by, for example, adding 0.5% by mass to 5% by mass, and preferably 1.5% by mass to 4% by mass, of hydrogen peroxide, the oxidizing agent is not limited to hydrogen peroxide.

An antigelling agent can be added to the polishing slurry to inhibit gelling of the abrasive. Examples of antigelling agents that are used preferably include phosphoric acid ester-based chelating agents such as 1-hydroxyethylidene-1,1-disphosphonic acid or aminotriethylene phosphonic acid. The antigelling agent is added within the range of 0.01% by mass to 6% by mass and preferably within the range of 0.05% by mass to 2% by mass.

In order to make the lattice disorder layer of the surface to be 3 nm or less in the polishing step of the present invention, following conditions are preferable. The size of damaged layers is preferably held to 50 nm by making the processing pressure during mechanical polishing prior to CMP to be 350 $g/cm^2$ or less and using abrasive grains having a diameter of 5 μm. During CMP, the polishing slurry preferably contains abrasive grains having a mean particle diameter of 10 nm to 150 nm and inorganic acid, and the pH at 20° C. is preferably lower than 2. It is more preferable that the abrasive grains are silica particles contained at 1% by mass to 30% by mass. It is more preferable that the inorganic acid is at least one selected from hydrochloric acid, nitric acid, phosphoric acid and sulfuric acid.

Figure 6:
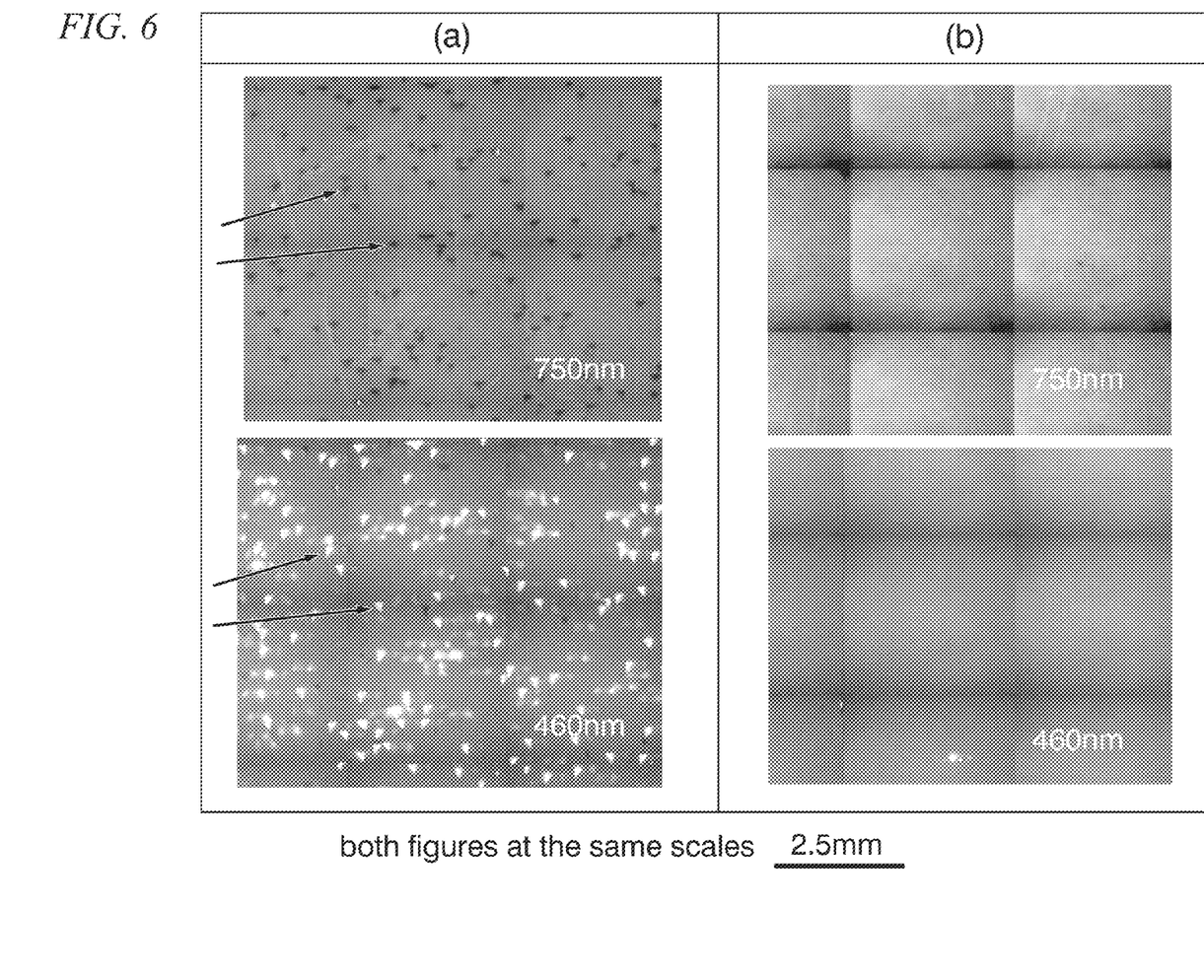
FIG. 6 are images of measuring the Si surface of a SiC epitaxial wafer having an off angle of 4° with an optical surface inspection apparatus using laser light, with (a) indicating an image of the SiC epitaxial wafer of the present invention, and (b) indicating an image of a conventional SiC epitaxial wafer.

FIG. 6(a) depicts PL images obtained by photoluminescence (PL) imaging of a SiC epitaxial wafer. The wafer is obtained by forming a SiC epitaxial film having a thickness of 10 μm on a SiC single crystal substrate that underwent polishing to a finish such that the lattice disorder layer remained at about 10 nm or more. In the PL image shown at the top of the figure, the detection wavelength was infrared wavelength of 750 nm or longer, and in the image, those portions that appear darker than the surrounding area indicate stacking faults that become carrier traps (and the arrows indicate a portion thereof). In addition, in the PL image shown at the bottom of the figure, the detection wavelength, which was measured by a band-pass filter, was 450±10 nm, and those portions that appear lighter than the surrounding area indicate stacking faults having an 8H structure (and the arrows indicate a portion thereof).

FIG. 6(b) depicts PL images obtained from a SiC epitaxial wafer obtained by similarly forming a SiC epitaxial film having a thickness of 10 μm on a SiC single crystal substrate in which the sample shown in FIG. 6(a) was re-polished until the lattice disorder layer was 3 nm or less.

In the PL images shown in FIG. 6(b), there were hardly any stacking faults observed, and basal plane dislocations (BPD) that are converted to stacking faults were determined to be able to be reduced by polishing. In particular, basal plane dislocations (BPD) were determined to be able to be effectively reduced by polishing until the lattice disorder layer was 3 nm or less.

<Basal Plane Dislocation Density Measurement Step>

The density of basal plane dislocations on the growth surface of a SiC single crystal substrate after polishing is measured using reflection X-ray topography.

<Cleaning (Gas Etching) Step>

In the cleaning step, the surface of the substrate is cleaned (gas-etched) at a temperature of 1400° C. to 1800° C. after the aforementioned polishing (polishing and convexity processing in the case forming convexity) in a hydrogen atmosphere.

The following provides an explanation of an embodiment of this step.

Gas etching is carried out for 5 minutes to 30 minutes at a hydrogen gas flow rate of 40 slm to 120 slm and pressure of 100 mbar to 250 mbar while holding the SiC single crystal substrate at 1400° C. to 1800° C.

After cleaning the SiC single crystal substrate after polishing, the substrate is placed in an epitaxial growth device such as a mass production type multi-wafer planetary CVD reactor. After introducing hydrogen gas into the device, the pressure is adjusted to 100 mbar to 250 mbar. Subsequently, the temperature of the device is raised so that the substrate temperature reaches 1400° C. to 1600° C. and preferably 1480° C. or higher, and gas etching is carried out on the substrate surface with hydrogen gas for 1 minute to 30 minutes. In the case of having carried out gas etching with hydrogen gas under these conditions, the etching amount is about 0.05 μm to 0.4 μm.

The substrate surface is subjected to damage by the polishing step, and in addition to damage that can be detected in the form of a "lattice disorder layer" by TEM, lattice strain and the like that is unable to be detected by TEM is also thought to be present at even greater depths. Although the purpose of gas etching is to remove a layer subjected to such damage (to be referred to as "damaged layers"), if damaged layer remain as a result of inadequate gas etching, heterogeneous polytypes, dislocations, stacking faults and the like end up being introduced into the epitaxial growth layer, while if etching is carried out excessively, the substrate surface undergoes surface reconstruction, and step bunching ends up occurring prior to the start of epitaxial growth. Accordingly, it is important to optimize the damaged layer and the gas etching amount. As a result conducting extensive research, the inventors of the present invention found that the combination of damaged layer resulting from reducing the thickness of the lattice disorder layer to 3 nm or less and the aforementioned gas etching conditions is an important condition for manufacturing SiC epitaxial wafers free of step bunching.

With respect to the surface of the substrate following cleaning (gas etching), the root mean square surface roughness Rq of the outermost surface of an epitaxial layer, which is obtained by analyzing a region covering 35% or more of the entire wafer using an optical surface inspection apparatus, can be confirmed to be 1.3 nm or less. In addition, in the case of measuring using an atomic force microscope, Rq is 1.0 nm or less for a square area measuring 10 μm on a side, 1.0 nm or less for a square area measuring 200 μm on a side, and the maximum height difference Ry during step bunching over a length of 100 μm to 500 μm observed in a square area measuring 200 μm on a side (short step bunching) can be confirmed to be 3.0 nm or less. In addition, the linear density of this step can be confirmed to be 5 $mm^{-1}$ or less.

It is important to maintain this degree of flatness of the substrate surface in the subsequent deposition step and temperature lowering step.

$SiH_4$ gas and/or $C_3H_8$ gas can also be added to the hydrogen gas. There are cases in which short step bunching may occur incidental to shallow pits attributable to screw dislocations. However, when gas etching is carried out by adding $SiH_4$ gas to the hydrogen gas at a concentration of less than 0.009 mol % to make the environment in the reactor rich in Si, it is possible to reduce the depth of the shallow pits and inhibit the occurrence of short step bunching occurring incidental to the shallow pits.

In the case of adding $SiH_4$ gas and/or $C_3H_8$ gas, the atmosphere inside the reactor is preferably returned to a hydrogen gas atmosphere by once evacuating the atmosphere inside the reactor prior to deposition (epitaxial growth) step.

<Deposition (Epitaxial Growth) Step>

In the deposition (epitaxial growth) step, the silicon carbide is made to undergo epitaxial growth by simultaneously supplying $SiH_4$ gas and $C_3H_8$ gas at a concentration ratio C/Si of 0.7 to 1.2 in an amount required for epitaxial growth of silicon carbide to the surface of the substrate following the aforementioned cleaning. When the growth temperature of the epitaxial film is higher than the cleaning (gas-etching) temperature, the temperature is increased before epitaxial growth starts.

In addition, "simultaneously supplying" means that supply-time difference of the gases is within several seconds, and is not used in the sense of requiring the gases to be supplied at precisely the same time. In the case of using the Hot Wall SiC CVD (VP2400HW) manufactured by Aixtron indicated in Examples to be subsequently described, SiC epitaxial wafers free of step bunching can be manufactured provided the time difference between the supply of $SiH_4$ gas and $C_3H_8$ gas is within 5 seconds.

The respective flow rate of the SiH4 gas and C3H8 gas, pressure of the SiH4 gas and $C_3H_8$ gas, substrate temperature and growth temperature are 15 sccm to 150 sccm, 3.5 sccm to 60 sccm, 80 mbar to 250 mbar, and higher than 1600° C. and 1800° C. or less, respectively, and are determined while controlling off angle, film thickness, carrier concentration uniformity and growth rate within a growth rate range of 1 μm to 20 μm per hour. Carrier concentration in the epitaxial layer can be controlled by introducing a doping gas in the form of nitrogen gas simultaneous to the start of deposition. Lowering the concentration ratio C/Si of the raw material gas supplied in order to increase the migration of Si atoms on the growth surface is known as a method of inhibiting step bunching during growth. In the present invention, the concentration ratio C/Si is 0.7 to 1.2. In addition, the film thickness of the epitaxial layer grown is normally about 5 μm to 20 μm, and the carrier concentration is about $2\times10^{15}$ $cm^{-3}$ to $15\times10^{15}$ $cm^{-3}$.

Deposition is carried out such that growth temperature and growth rate are determined as indicated below corresponding to the off angle of the SiC single crystal substrate, namely:

(1) in the case of using a 4H—SiC single crystal substrate having an off angle of 0.4° to 2°, deposition is carried out at a growth rate of 1 μm/h to 3 μm/h when the growth temperature at which the silicon carbide film is made to undergo epitaxial growth is 1600° C. to 1640° C., at a growth rate of 3 μm/h to 4 μm/h when the growth temperature is 1640° C. to 1700° C., and at a growth rate of 4 μm/h to 10 μm/h when the growth temperature is 1700° C. to 1800° C., and (2) in the case of using a 4H—SiC single crystal substrate having an off angle of 2° to 5°, deposition is carried out at a growth rate of 2 μm/h to 4 μm/h when the growth temperature at which the silicon carbide film is made to undergo epitaxial growth is 1600° C. to 1640° C., at a growth rate of 4 μm/h to 10 μm/h when the growth temperature is 1640° C. to 1700° C., and at a growth rate of 10 μm/h to 20 μm/h when the growth temperature is 1700° C. to 1800° C.

<Temperature Lowering Step>

In the temperature lowering step, it is preferable that the temperature is lowered after simultaneously discontinuing the supply of $SiH_4$ gas and $C_3H_8$ gas and maintaining the substrate temperature until the $SiH_4$ gas and $C_3H_8$ gas are evacuated.

Following deposition, although the temperature is lowered after discontinuing the supply of $SiH_4$ gas and $C_3H_8$ gas and discontinuing the introduction of nitrogen gas used as a doping gas, at this time as well, the morphology of the surface can be exacerbated due to the occurrence of gas etching on the surface of the SiC epitaxial film. In order to inhibit this exacerbation of surface morphology, the timing at which the supply of $SiH_4$ gas and $C_3H_8$ gas is discontinued and the timing at which the temperature is lowered are important. It was determined that exacerbation of morphology is inhibited by maintaining the growth temperature until the supplied SiH$_4$ gas and C$_3$H$_8$ gas are no longer present on the substrate surface after having simultaneously discontinued the supply of these gases, and subsequently lowering the temperature to room temperature at a rate of about 50° C. per minute.

<Conversion Ratio Determination Step>

In this step, a ratio of basal plane dislocations (BPD), which causes stacking faults in a SiC epitaxial film of a prescribed thickness which is formed on a SiC single crystal substrate, to all basal plane dislocations which are present on a growth surface of the SiC single crystal substrate is determined.

First, using photoluminescence (PL) imaging method, the surface density of stacking faults (SF) in a SiC epitaxial film is measured with respect to a SiC epitaxial wafer fabricated according to the aforementioned steps.

Next, a ratio of basal plane dislocations (BPD), which causes stacking faults in a SiC epitaxial film of a prescribed thickness which is formed on a SiC single crystal substrate, to all basal plane dislocations which are present on a growth surface of the SiC single crystal substrate is determined from the preliminarily measured surface density of basal plane dislocations (BPD) present on the growth surface of the SiC single crystal substrate and the surface density of stacking faults (SF) obtained.

More specifically, this ratio can be determined from the graph shown in FIG. 3.

Samples used for determining conversion ratio are preferably deposited simultaneously. This is because variations easily occur in growth conditions if samples of different production lots are used.

<BPD Surface Density Upper Limit Determination Step>

In this step, the upper limit of surface density of BPD on the growth surface of the SiC single crystal substrate used is determined based on the determined ratio.

Namely, the upper limit of surface density of BPD on the growth surface of the SiC single crystal substrate able to be used to obtain a SiC epitaxial wafer having a stacking fault surface density equal to or less than a desired surface density is determined from the determined ratio.

<SiC Epitaxial Film Formation Step>

In this step, a SiC epitaxial film is formed on the SiC single crystal substrate using a SiC single crystal substrate having a BPD surface density equal to or less than the determined upper limit under the same conditions as the epitaxial film growth conditions used in the step for determining the ratio.

Second Embodiment

The method of manufacturing a SiC epitaxial wafer of a second embodiment of the present invention is characterized as a method of manufacturing a SiC epitaxial wafer provided with a SiC epitaxial layer on a SiC single crystal substrate having an off angle. The method comprises: a step of determining a ratio of basal plane dislocations (BPD) and threading screw dislocations (TSD), which cause carrot defects in a SiC epitaxial film of a prescribed thickness which is formed on a SiC single crystal substrate having an off angle, to all basal plane dislocations and all threading screw dislocations which are present on a growth surface of the SiC single crystal substrate, a step of determining an upper limit of surface density of basal plane dislocations of the growth surface of a used SiC single crystal substrate based on the above ratio, and a step of preparing a SiC single crystal substrate which has surface density equal to or less than the above upper limit, and forming a SiC epitaxial film on the SiC single crystal substrate under the same conditions as the growth conditions of the epitaxial film used in the step of determining the ratio.

The following provides an explanation of the points of the method of manufacturing a SiC epitaxial wafer of the present embodiment that differ from those of the first embodiment.

<Basal Plane Dislocation Density and Threading Screw Dislocation Density Measurement Step>

The densities of basal plane dislocations and threading screw dislocations on the growth surface of a SiC single crystal substrate after polishing are measured using reflection X-ray topography.

<Conversion Ratio Determination Step>

In this step, a ratio of basal plane dislocations (BPD) and threading screw dislocations (TSD), which cause carrot defects in a SiC epitaxial film of a prescribed thickness which is formed on a SiC single crystal substrate having an off angle, to all basal plane dislocations and all threading screw dislocations which are present on a growth surface of the SiC single crystal substrate is determined.

Since carrot defects are formed as a result of interaction between basal plane dislocations (BPD) and threading screw dislocations (TSD), the conversion ratio to carrot defects dependent on the two variables (two types of dislocation densities). Namely, for example, even if the surface density of basal plane dislocations is the same, in the case that the surface densities of threading screw dislocations differ, the conversion ratios of carrot defects also differ.

However, in the case that the surface density of threading screw dislocations is adequately high (such as in the case the surface density of threading screw dislocations is 10$^3$ TSD/cm$^2$ or more relative to the surface density of basal plane dislocations being 10$^4$ BPD/cm$^2$ or more), the carrot defect conversion ratio is roughly 1/10,000 to 1/100,000 of the surface density of the basal plane dislocations.

Thus, in the case that the surface density of threading screw dislocations is adequately high in the relationship with the surface density of basal plane dislocations, the carrot defect conversion ratio with respect to the surface density of the basal plane dislocations can be used as the aforementioned ratio.

First, with respect to a fabricated SiC epitaxial wafer, the surface density of carrot defects in a SiC epitaxial film thereof is measured using photoluminescence (PL) imaging method.

Next, a ratio of basal plane dislocations (BPD), which causes carrot defects in a SiC epitaxial film of a prescribed thickness which is formed on a SiC single crystal substrate, to all basal plane dislocations which are present on a growth surface of the SiC single crystal substrate is determined from the preliminarily measured surface densities of basal plane dislocations (BPD) and threading screw dislocations (TSD) present on the growth surface of the SiC single crystal substrate and the surface density of carrot defects obtained above.

Samples used for determining conversion ratio are preferably deposited simultaneously. This is because variations easily occur in growth conditions if samples of different production lots are used.

<BPD and TSD Surface Density Upper Limit Determination Step>

In this step, the upper limit of surface density of BPD and TSD on the growth surface of the SiC single crystal substrate used is determined based on the determined ratio.

Namely, the upper limit of surface density of BPD and TSD on the growth surface of the SiC single crystal substrate able to be used to obtain a SiC epitaxial wafer having a carrot defect surface density equal to or less than a desired surface density is determined from the determined ratio.

<SiC Epitaxial Film Formation Step>

In this step, a SiC epitaxial film is formed on a SiC single crystal substrate using a SiC single crystal substrate having a BPD and TSD surface density equal to or less than the determined upper limit under the same conditions as the epitaxial film growth conditions used in the step for determining the ratio.

EXAMPLES

Although the following provides a more detailed explanation of the present invention through examples thereof, the present invention is not limited to these examples.

In the present examples, $SiH_4$ was used as a silicon-containing gas, $C_3H_8$ gas was used as a carbon-containing gas, $N_2$ gas was used as a doping gas, $H_2$ gas was used as a carrier gas and etching gas, and SiC epitaxial film was grown on a Si surface or C surface slightly inclined in the direction of the <11-20> axis with respect to the (0001) plane of 4H—SiC single crystal by using the Hot Wall SiC CVD (VP2400HW) manufactured by Aixtron which is amass production type multi-wafer planetary (rotary and revolutionary) CVD reactor.

Example 1

SiC epitaxial wafers were manufactured in which a SiC epitaxial layer was formed on the Si surface of a 4H—SiC single crystal substrate inclined at an off angle of 4°.

In the present example, the 4H—SiC single crystal substrate was not subjected to convexity processing.

First, in order to determine the ratio of conversion to stacking faults (SF), four SiC single crystal substrates were polished under four types of polishing conditions. The four surface densities of the basal plane dislocations (BPD) shown in Table 1 are equivalent to the surface densities of basal plane dislocations (BPD) of SiC single crystal substrates polished under those polishing conditions.

The SiC single crystal substrate having the lowest BPD density was polished under the polishing conditions indicated below. Namely, mechanical polishing prior to CMP was carried out at a processing pressure of 350 g/cm$^2$ using abrasive grains having a diameter of 5 μm or less. CMP was carried out for 30 minutes using polishing slurry containing sulfuric acid as inorganic acid and having a pH at 20° C. of 1.9 and silica particles having a mean particle diameter of 10 nm to 150 nm as the abrasive grains. As a result, the lattice disorder layer of the surface was 3 nm or less.

After subjecting the polished substrate to RCA cleaning, the substrate was loaded into a growth device. RCA cleaning refers to a wet cleaning method commonly used to clean Si wafers, and enables the removal of organic matter, heavy metals and particles on the substrate surface using a solution comprising a mixture of sulfuric acid, ammonia, hydrochloric acid and hydrogen peroxide water and a hydrofluoric acid solution.

In the cleaning (gas etching) step, gas etching was carried out for 20 minutes at a hydrogen gas flow rate of 100 slm, reactor internal pressure of 200 mbar and substrate temperature of 1500° C.

In the SiC epitaxial growth step, epitaxial growth was carried out by setting the substrate temperature to 1650° C., and simultaneously initiating supply of $C_3H_8$ gas at 24 sccm and $SiH_4$ gas at 8 sccm so that both gases were simultaneously supplied to the main surface of the substrate. A value of 1.0 was selected for the C/Si ratio. The growth step was carried out for 2 hours by setting the reactor internal pressure to 200 mbar and the growth rate to 5 μm/h to deposit a SiC epitaxial layer having a thickness of 10 μm.

Next, the surface density of stacking faults (SF) in the SiC epitaxial film was measured for the obtained SiC epitaxial wafers using photoluminescence (PL) imaging method. The four values of stacking fault (SF) surface density shown in Table 1 were obtained.

Next, based on the graph shown in FIG. 3, a value of $1.0 \times 10^3$ BPD/cm$^2$ was determined as the upper limit of BPD surface density of the growth surface of a SiC single crystal substrate used in order to obtain SiC epitaxial wafers having a stacking fault surface density of 0.1 SF/cm$^2$ or less.

In order to obtain a SiC single crystal substrate having BPD surface density equal to or less than this upper limit, polishing conditions were adjusted so that the lattice disorder layer was 2.5 nm or less.

Basal plane dislocation density on the growth surface of the SiC single crystal substrate after polishing was measured by using reflection X-ray topography and said density was $0.9 \times 10^3$ BSD/cm$^2$.

SiC epitaxial wafers were then manufactured using this SiC single crystal substrate by treating the substrate and forming a SiC epitaxial layer under the same conditions as the aforementioned conditions.

Stacking fault surface density of the resulting the SiC epitaxial wafer was measured by photoluminescence (PL) imaging method and said density was 0.09 SF/cm$^2$.

INDUSTRIAL APPLICABILITY

The present invention can be applied to a SiC epitaxial wafer and a manufacturing method thereof.

The invention claimed is:

1. A method of manufacturing a SiC epitaxial wafer wherein a 4H—SiC single crystal epitaxial layer is provided on a 4H—SiC single crystal substrate having an off angle, comprising:
    a step of determining a ratio of basal plane dislocations (BPD), which causes stacking faults during an epitaxial growth in a 4H—SiC epitaxial film of a prescribed thickness which is formed on a 4H—SiC single crystal substrate having an off angle, to basal plane dislocations which are present on a growth surface of the 4H—SiC single crystal substrate,
    a step of determining an upper limit of surface density of basal plane dislocations on the growth surface of a 4H—SiC single crystal substrate used based on the above ratio, and
    a step of preparing a 4H—SiC single crystal substrate which has surface density equal to or less than the above upper limit, and forming a 4H—SiC epitaxial film on the 4H—SiC single crystal substrate under the same conditions as the growth conditions of the epitaxial film used in the step of determining the ratio.

2. The method of manufacturing a SiC epitaxial wafer according to claim 1, wherein, when determining the ratio, the surface density of BPD on the growth surface and a surface density of stacking faults in the 4H—SiC epitaxial film caused by the BPD on the growth surface are measured by X-ray topography or photoluminescence.

3. The method of manufacturing a SiC epitaxial wafer according to claim 1, wherein the upper limit is $1.0 \times 10^3$ BPD/cm$^2$ or less.

4. The method of manufacturing a SiC epitaxial wafer according to claim 1, wherein, when determining the ratio, a surface density of stacking faults in the 4H—SiC epitaxial film caused by the BPD on the growth surface is measured by photoluminescence.

5. A method of manufacturing a SiC epitaxial wafer provided with a 4H—SiC single crystal epitaxial layer on a 4H—SiC single crystal substrate having an off angle, comprising:

a step of determining a ratio of basal plane dislocations (BPD) and threading screw dislocations (TSD), which cause carrot defects in a 4H—SiC epitaxial film of a prescribed thickness which is formed on a 4H—SiC single crystal substrate having an off angle, to all basal plane dislocations and all threading screw dislocations which are present on a growth surface of the 4H—SiC single crystal substrate, a step of determining an upper limit of surface density of BPD and TSD on the growth surface of a 4H—SiC single crystal substrate used based on the above ratio, and a step of preparing a 4H—SiC single crystal substrate which has surface density equal to or less than the above upper limit, and forming a 4H—SiC epitaxial film on the 4H—SiC single crystal substrate under the same conditions as the growth conditions of the epitaxial film used in the step of determining the ratio.

6. A SiC epitaxial wafer provided with a 4H—SiC single crystal epitaxial layer on a 4H—SiC single crystal substrate having an off angle, wherein the surface density of stacking faults caused by BPD of the 4H—SiC single crystal substrate is 0.1 stacking faults/$cm^2$ or less in the 4H—SiC epitaxial film.

\* \* \* \* \*